(12) United States Patent
Chong et al.

(10) Patent No.: US 11,119,146 B1
(45) Date of Patent: Sep. 14, 2021

(54) TESTING OF BONDED WAFERS AND STRUCTURES FOR TESTING BONDED WAFERS

(71) Applicant: XILINX, INC., San Jose, CA (US)

(72) Inventors: Nui Chong, San Jose, CA (US); Yan Wang, San Jose, CA (US); Hui-Wen Lin, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/997,630

(22) Filed: Aug. 19, 2020

(51) Int. Cl.
  *G01R 31/28* (2006.01)
  *H01L 21/66* (2006.01)

(52) U.S. Cl.
  CPC .......... *G01R 31/2853* (2013.01); *H01L 22/32* (2013.01); *H01L 22/34* (2013.01)

(58) Field of Classification Search
  CPC ...... G01R 31/2853; H01L 22/32; H01L 22/34
  USPC .................................. 324/762.01, 537, 500
  See application file for complete search history.

(56) References Cited

U.S. PATENT DOCUMENTS

| 8,219,340 | B2 | 7/2012 | Su et al. | |
|---|---|---|---|---|
| 2011/0080184 | A1 | 4/2011 | Wu et al. | |
| 2013/0293255 | A1 | 11/2013 | Wu et al. | |
| 2021/0066171 | A1* | 3/2021 | Kim | H01L 22/14 |
| 2021/0156902 | A1* | 5/2021 | Ke | G01R 31/2644 |
| 2021/0166982 | A1* | 6/2021 | Hsu | H01L 22/14 |

* cited by examiner

*Primary Examiner* — Giovanni Astacio-Oquendo
(74) *Attorney, Agent, or Firm* — Patterson + Sheridan, LLP

(57) ABSTRACT

Examples described herein generally relate to testing of bonded wafers and structures implemented for such testing. In an example method, power is applied to a first pad on a stack of bonded wafers. A wafer of the stack includes a process control monitor (PCM) region that includes structure regions. Each structure region is a device under test region, dummy region, and/or chain interconnect region (CIR). The stack includes a serpentine chain test structure (SCTS) electrically connected between first and second metal features in the wafer in first and second CIRs, respectively, in the PCM region. The SCTS includes segments, one or more of which are disposed between neighboring structure regions in the PCM region that are not the first and second CIRs. A signal is detected from a second pad on the stack. The first and second pads are electrically connected to the first and second metal features, respectively.

20 Claims, 8 Drawing Sheets

TESTING OF BONDED WAFERS AND STRUCTURES FOR TESTING BONDED WAFERS

TECHNICAL FIELD

Examples of the present disclosure generally relate to testing of bonded wafers and structures implemented for testing bonded wafers.

BACKGROUND

Integrated circuit (IC) dies typically include numerous electrical and/or electronic elements that are fabricated on, for example, silicon wafers to perform a particular function. Recently, three-dimensional ICs (3DICs) have been developed. In some implementations, a 3DIC can be fabricated by bonding wafers together. After the bonding, additional processing can be performed on at least one of the wafers. Such processing can be tested to identify defects or characteristics of connections created by the bonding and of components that are formed by the additional processing. For example, if the bonding of the wafers was misaligned, connections between the wafers may not be formed properly. Further, for example, if the additional processing includes a lithography step and a misalignment occurred during that lithography step, a via or metal line may not contact or may contact with a small contact area, e.g., another via or metal line. The testing can detect such defects, for example, by a test structure being tested not forming a current loop (e.g., due to no contact being formed as a result of the misalignment) or by the test structure being tested having a high resistance (e.g., due to a small contact area being formed as a result of the misalignment).

SUMMARY

Examples described herein generally relate to testing of bonded wafers and structures implemented for testing bonded wafers. Generally, according to various examples, one or more wafers that are to be bonded together are fabricated with a process control monitor (PCM) region. The PCM region can be fabricated to implement a serpentine chain test structure in the bonded wafers. By implementing a serpentine chain test structure as described, the number of components serially connected in the serpentine chain test structure can be larger such that a test of the serpentine chain test structure can be more statistically meaningful.

An example described herein is a method for testing. Power is applied to a first pad on a stack of bonded wafers. A first wafer of the stack of bonded wafers includes a first PCM region. The first PCM region includes first structure regions in the first wafer. Each first structure region of the first structure regions is a device under test region, a dummy region, a chain interconnect region, or a combination thereof. The stack of bonded wafers includes a first serpentine chain test structure electrically connected between a first metal feature in the first wafer in a first chain interconnect region in the first PCM region and a second metal feature in the first wafer in a second chain interconnect region in the first PCM region. The first serpentine chain test structure includes first segments. One or more segments of the first segments are disposed between neighboring first structure regions in the first PCM region that are not the first chain interconnect region and the second chain interconnect region. The first pad is electrically connected to the first metal feature. A first signal is detected from a second pad on the stack of bonded wafers. The second pad is electrically connected to the second metal feature. The first signal is a response of, at least in part, the first serpentine chain test structure to the applied power.

Another example described herein is a method for fabrication. A first wafer is bonded to a second wafer. The first wafer and the second wafer are included in a stack of bonded wafers. The first wafer includes a PCM region. The PCM region includes an array of structure regions. Each structure region of the structure regions is a device under test region, a dummy region, a chain interconnect region, or a combination thereof. The stack of bonded wafers includes a serpentine chain test structure electrically connected between a first metal feature in the first wafer in a first chain interconnect region in the PCM region and a second metal feature in the first wafer in a second chain interconnect region in the PCM region. The first chain interconnect region is in a first row of the array. The second chain interconnect region is in a second row of the array. The serpentine chain test structure includes segments. One or more segments of the segments are disposed laterally between respective structure regions that are in neighboring columns of the array and that are outside of the first row and the second row. The stack of bonded wafers is tested. The testing includes: applying power to a first pad on the stack of bonded wafers, and detecting a signal from a second pad on the stack of bonded wafers. The first pad is electrically connected to the first metal feature. The second pad is electrically connected to the second metal feature. The signal is a response of, at least in part, the serpentine chain test structure to the applied power.

Another example described herein is a method for testing. Power is applied to a first pad on a stack of bonded wafers. The stack of bonded wafers includes a PCM region. The PCM region includes an array of structure regions. Each structure region of the structure regions is a device under test region, a dummy region, a chain interconnect region, or a combination thereof. The stack of bonded wafers includes a serpentine chain test structure electrically connected between a first chain interconnect region in the array of the PCM region and a second chain interconnect region in the array of the PCM region. The serpentine chain test structure includes serially connected segments. One or more segments of the segments are disposed in a region between neighboring structure regions that are in different columns in the array and that are in a row of the array different from a row in which the first chain interconnect region or the second chain interconnect region is disposed. The first pad is electrically connected to the first chain interconnect region. A signal is detected from a second pad on the stack of bonded wafers. The second pad is electrically connected to the second chain interconnect region. The signal is a response of, at least in part, the serpentine chain test structure to the applied power.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
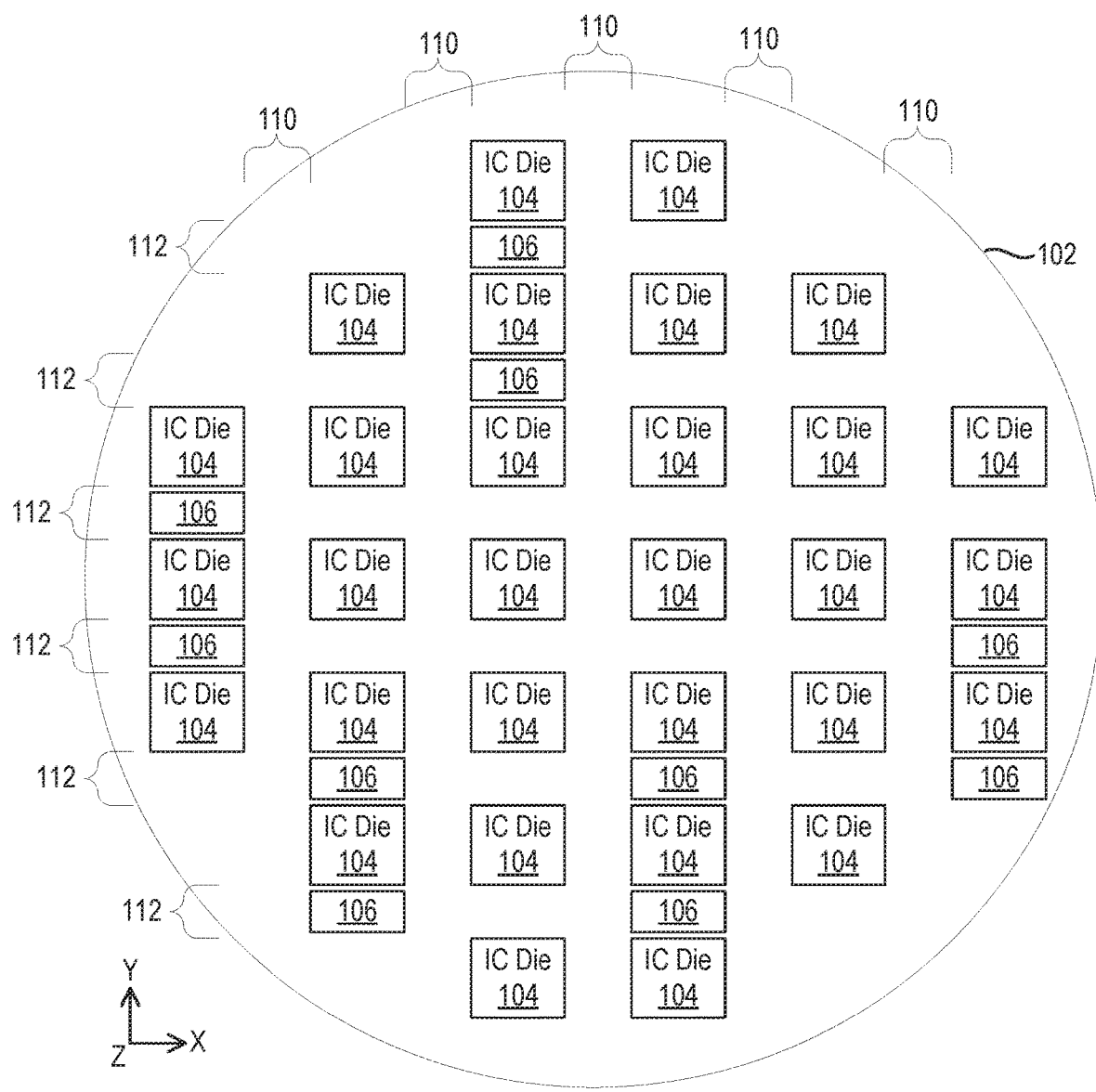
FIG. 1 depicts a simplified layout of a wafer according to some examples.

Examples described herein generally relate to testing of bonded wafers and structures implemented for testing bonded wafers. Generally, according to various examples, one or more wafers that are to be bonded together are fabricated with a process control monitor (PCM) region. The PCM region can be fabricated to implement a serpentine chain test structure in the bonded wafers. In some examples, a serpentine chain test structure can be formed wholly within one respective wafer, and in some examples, a serpentine chain test structure can be partially formed in each of multiple wafers, where bonding the multiple wafers together implements the serpentine chain test structure. A serpentine chain test structure can include through-substrate vias (TSVs) in a wafer, bonded bond pads at an interface between bonded wafers, or a combination thereof, which are serially connected together. A serpentine chain test structure can have one or more segments that is disposed between other structure regions (e.g., device under test (DUT) regions and/or dummy regions) in the PCM region that are not electrically connected to the serpentine chain test structure. As such, the serpentine chain test structure can have a large number of serially connected components (e.g., TSVs, bonded bond pads, or a combination), which when the number is sufficiently large, may be referred to as a mega chain.

Various examples include testing one or more serpentine chain test structures. In some examples, each wafer in the stack of bonded wafers includes metal features, e.g., metal lines and/or vias, between which a respective serpentine chain test structure is electrically and physically connected. By each wafer having such connections to a serpentine chain test structure, in some examples, each wafer that has TSVs can have TSVs included in a serpentine chain test structure, and each bonding interface between bonded wafers can have bonded bond pads included in a serpentine chain test structure. Hence, bonding of the wafers and backside processing of wafers can be adequately tested and monitored.

By implementing a serpentine chain test structure as described, the number of components serially connected in the serpentine chain test structure can be larger such that a test of the serpentine chain test structure can be more statistically meaningful. A test loop (e.g., an electrical path) that includes a serpentine chain test structure can include various components outside of the serpentine chain test structure, such as metal features in a metal stack that extend between a probe pad and the serpentine chain test structure. The larger the number of components in the serpentine chain test structure is, the less proportional impact the components in the test loop outside of the serpentine chain test structure have on the overall resistance of the test loop. Hence, components within the serpentine chain test structure can be attributed with a more accurate resistance by the test.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Additionally, reference to a column or row is for ease of description herein and each does not necessarily indicate a particular direction. In different orientations, a column may be referred to as a row, and vice versa.

FIG. 1 depicts a simplified layout of a wafer 102 according to some examples. The wafer 102, as illustrated, has undergone Front End-of-Line (FEOL) and Back End-of-Line (BEOL). The wafer 102 has a number of integrated circuit (IC) dies 104 and a number of process control monitor (PCM) regions 106. In the illustrated example, the IC dies 104 are arranged in columns and rows on the wafer 102. A respective column scribe line 110 is on the wafer 102 between neighboring columns of the IC dies 104. In the illustrated example, each column scribe line 110 extends longitudinally in a y-direction, and the column scribe lines 110 extend longitudinally parallel to each other. A respective row scribe line 112 is on the wafer 102 between neighboring rows of the IC dies 104. In the illustrated example, each row scribe line 112 extends longitudinally in an x-direction, and the row scribe lines 112 extend longitudinally parallel to each other. Each y-direction that a column scribe line 110 longitudinally extends intersects with each x-direction that a row scribe line 112 longitudinally extends (e.g., although the respective scribe lines may not intersect). As a person having ordinary skill in the art will readily understand, the column scribe lines 110 and row scribe lines 112 are regions where dicing is to be performed to singulate the IC dies 104 from the remainder of the wafer 102.

The wafer 102 is to be wafer bonded to one or more other wafers. Any wafer that is bonded can further undergo backside processing. Each of the wafers that are to be bonded include PCM regions 106 that are aligned such that the PCM regions 106 can be electrically connected together when the wafers are bonded. The PCM regions 106 can then be probed and tested after the wafers have been bonded together. The arrangement of PCM regions 106 can vary from the illustration in FIG. 1.

Figure 2:
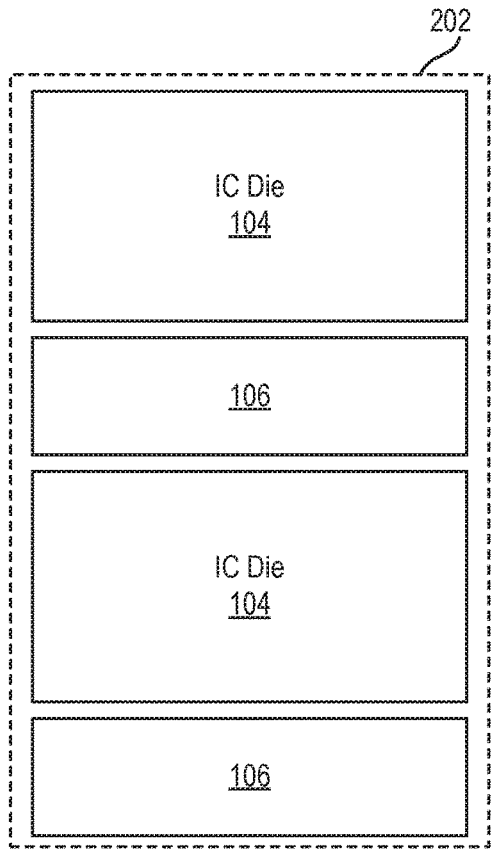
FIG. 2 depicts a reticle field of a mask to pattern according to some examples.

FIG. 2 depicts a reticle field 202 of a mask to pattern according to some examples. The reticle field 202 includes two IC dies 104 and two PCM regions 106 arranged in an alternating fashion. Any number of masks can be implemented to fabricate an IC die 104 and PCM region 106. The reticle fields of different masks can be aligned on the wafer in appropriate manners, e.g., in different lithography steps, to fabricate the IC dies 104 and PCM regions 106 of the reticle fields.

Figure 3:
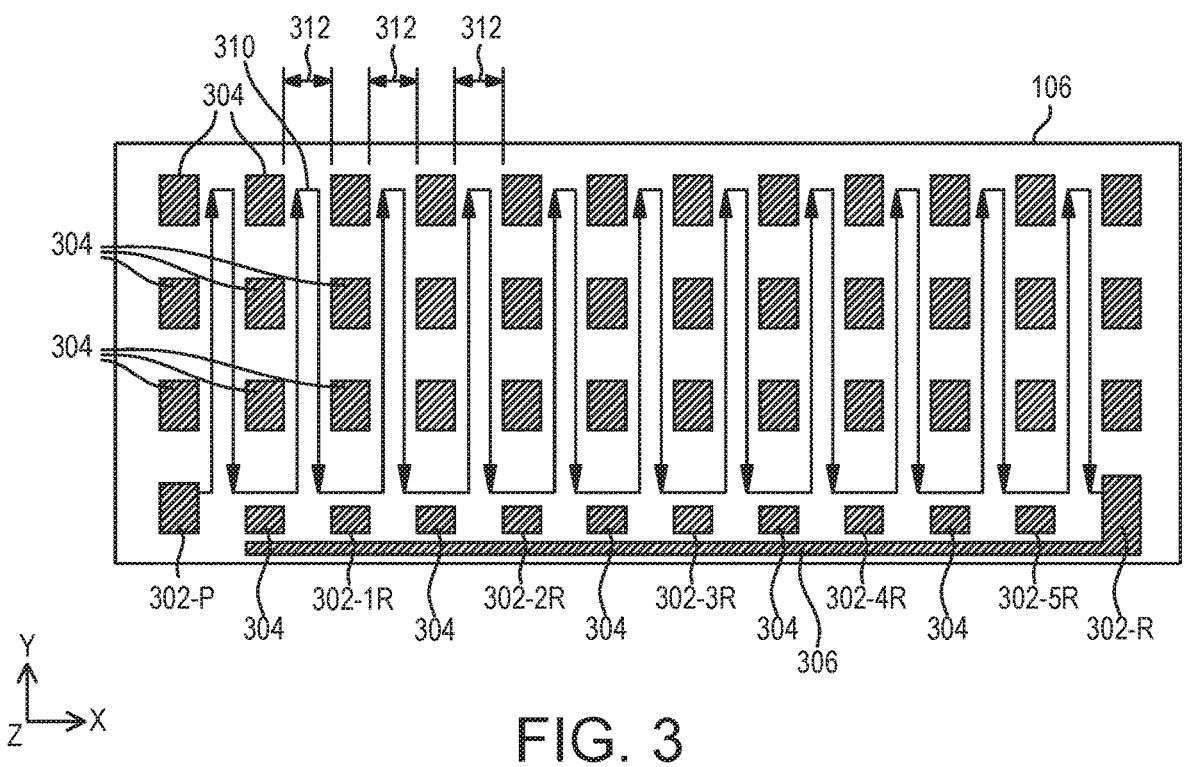
FIG. 3 depicts a simplified layout of a process control monitor (PCM) region according to some examples.

FIG. 3 depicts a simplified layout of a PCM region 106 according to some examples. The PCM region 106 includes an array of structure regions. Each structure region of the array can be a chain interconnect region 302, a device under test (DUT) region, and/or a dummy region. For simplicity, a DUT and/or dummy region is indicated in FIG. 3 and referred to herein as DD region 304. In the illustrated example of FIG. 3, the array of structure regions includes four rows (e.g., each row extending along an x-direction) and twelve columns (e.g., each column extending along a y-direction). Other examples contemplate arrays of any size. For example, some examples contemplate eleven rows in an array of structure regions. Additionally, an array may be non-orthogonal, such as a honeycomb array. In other examples, the structure regions can be arranged in any configuration (e.g., not in an array, such as in a stochastic arrangement).

A DD region 304 that is a DUT region includes one or more DUTs (e.g., a process control monitor (PCM)). A DUT can include any of a transistor, a diode, a capacitor, a metal stack (e.g., metal lines and/or vias), and any other appropriate active or passive device or structure. A DUT can be formed fully or partially in a semiconductor substrate of the wafer, in one or more metallization layers (e.g., including metal lines and/or vias) in respective one or more front side dielectric layers on a front side of the semiconductor substrate, and/or in one or more metallization layers in respective one or more backside dielectric layers on a backside of the semiconductor substrate. Further, a single DUT can be formed across multiple wafers, in some examples. A person having ordinary skill in the art will readily understand various DUTs that can be formed and disposed in a DUT region.

A DD region 304, whether a DUT region or a dummy region, can include a number of bond pads and interconnections. The bond pads are formed on the wafer at a surface that will be bonded to another wafer (which will be described in more detail subsequently). The bond pads can be functional pads, such as to carry a signal to or from a DUT, or can be dummy pads, which may not carry a signal and may promote processing uniformity and bonding adhesion. The interconnections can include any combination of metal lines and vias in any metallization layer and through-substrate vias (TSVs) electrically connected together. These interconnections can be functional interconnections, such as electrically connected to functional bond pads and to respective DUTs, or can be dummy interconnections, such as to promote uniformity of processing.

In the illustrated example, each DD region 304 is laterally self-contained (e.g., in x and y-directions) within a lateral boundary of the respective DD region 304. Each DD region 304 does not have a component (e.g., a metal line) that crosses a lateral boundary (e.g., a boundary in an X-Z plane or in a Y-Z plane in the illustrated example) of the DD region 304. Each DD region 304 can be electrically connected (e.g., by bond pads, metal lines, vias, and/or TSVs) to an overlying DD region and/or an underlying DD region of an overlying and/or underlying wafer, respectively, in a bonded wafer stack. Each DD region 304 can be unaffected by a serpentine test structure.

The chain interconnect regions 302 can each be like a DD region 304, as described above, except that the chain interconnect regions 302 include electrical connections to a serpentine chain test structure that is outside of the lateral boundary of the respective chain interconnect region 302. In the illustrated example, the chain interconnect regions 302 are aligned in a same row of the array in the PCM region 106. The chain interconnect regions 302 include a power chain interconnect region 302-P, a general return chain interconnect region 302-R, a first die return chain interconnect region 302-1R, a second die return chain interconnect region 302-2R, a third die return chain interconnect region 302-3R, a fourth die return chain interconnect region 302-4R, and a fifth die return chain interconnect region 302-5R.

A return interconnect 306 extends from the general return chain interconnect region 302-R and along the die return chain interconnect regions 302-1R, 302-2R, 302-3R, 302-4R, 302-5R. The return interconnect 306 is connected to the general return chain interconnect region 302-R and one of the die return chain interconnect regions 302-1R, 302-2R, 302-3R, 302-4R, 302-5R in the PCM region 106. The return interconnect 306 is connected to the general return chain interconnect region 302-R and the fifth die return chain interconnect region 302-5R in FIG. 1 for illustration purposes.

A serpentine chain test structure 310 is electrically connected between the power chain interconnect region 302-P and the general return chain interconnect region 302-R. The serpentine chain test structure 310 can include a chain of serially connected TSVs and/or bond pads. Hence, although the serpentine chain test structure 310 may be described in the context of one wafer, a serpentine chain test structure 310 may be formed with components of two or more wafers. Examples are illustrated in a subsequently described figure.

The serpentine chain test structure 310 includes segments disposed in regions 312 of the PCM region 106 laterally between columns of structure regions and between neighboring structure regions that are in a row of the array in which the chain interconnect regions 302 are not disposed. Each segment of the serpentine chain test structure 310 is disposed between neighboring structure regions that are not the power chain interconnect region 302-P and the general return chain interconnect region 302-R. Each segment of the serpentine chain test structure 310 is disposed laterally between structure regions that are in neighboring columns of the array and that are outside of the row in which the power chain interconnect region 302-P is disposed and the row in which the general return chain interconnect region 302-R is disposed. Each segment of the serpentine chain test structure 310 is disposed in a region 312 between neighboring structure regions that are in different columns in the array and that are in a row of the array different from a row in which the power chain interconnect region 302-P or the general return chain interconnect region 302-R is disposed. For example, the serpentine chain test structure 310 is disposed laterally between neighboring structure regions within a same row of the array and extends substantially parallel to columns of the structure regions of the array. Because the serpentine chain test structure 310 is disposed laterally between neighboring columns of DD regions 304, such DD regions 304 can be unaffected by the serpentine chain test structure 310 and can be unmodified based on the presence of the serpentine chain test structure 310. The serpentine chain test structure 310 can serpentine with any number of switchbacks between neighboring columns.

The serpentine chain test structure 310 crosses columns of the array disposed between the power chain interconnect region 302-P and the general return chain interconnect region 302-R near the die return chain interconnect regions 302-1R, 302-2R, 302-3R, 302-4R, 302-5R and DD regions 304 in a same row as the power chain interconnect region 302-P and the general return chain interconnect region 302-R. Respective sizes of these die return chain interconnect regions 302-1R, 302-2R, 302-3R, 302-4R, 302-5R and DD regions 304 can be reduced (e.g., relative to other DD regions 304 and in a y-direction) to accommodate for area for the serpentine chain test structure 310 to cross the respective column.

Figure 4:
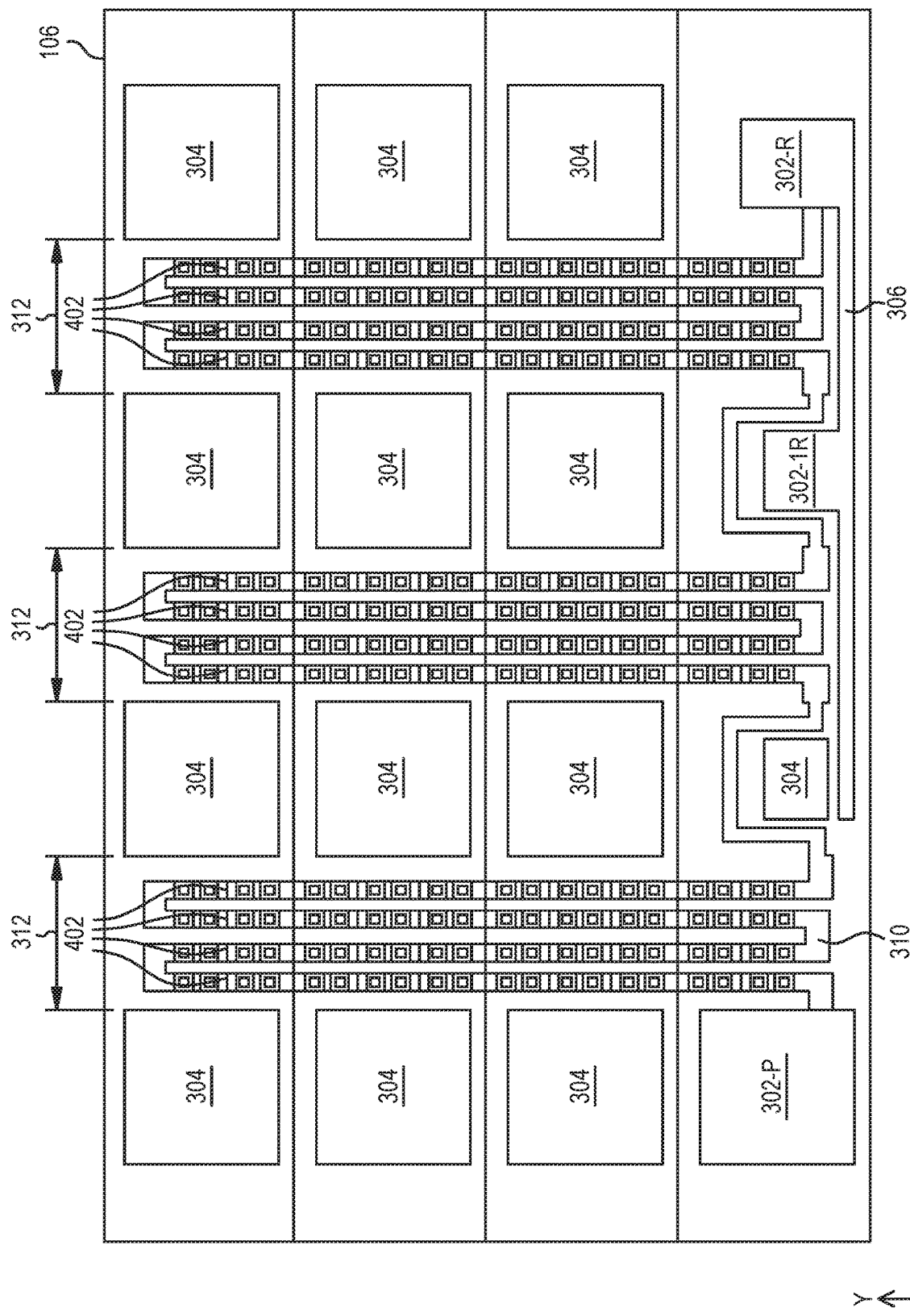
FIG. 4 depicts an even further simplified layout of a PCM region with additional details of a serpentine chain test structure according to some examples.

FIG. 4 depicts an even further simplified layout of a PCM region 106 with additional details of a serpentine chain test structure 310 according to some examples. The array in FIG. 4 is simplified and smaller for illustrative purposes. FIG. 4 illustrates how the serpentine chain test structure 310 can switchback a number of times in a region 312. In FIG. 4, the serpentine chain test structure 310 has four segments 402 that extend across the four rows of the array in each region 312. Any number of segments spanning any number of the rows of the array can be implemented.

At a current technology node, in some examples, a structure region can have a lateral boundary that is, e.g., approximately 55 μm (in an x-direction)×55 μm (in a y-direction). A width of a row (in a y-direction) of the array a can be approximately 60 μm, which permits approximately 10 μm of separation in a y-direction between neighboring structure regions within a column. A spacing of the region 312 between columns can be approximately 50 μm (in an x-direction). With a 1.4 μm pitch for neighboring TSVs and for neighboring bond pads, examples at this technology node can achieve over 100,000 instances of TSVs and/or bond pads for a serpentine chain test structure implemented across four rows of an array of structure regions of a PCM, like illustrated in FIG. 3. Such a serpentine chain test structure can have a resistance between 50 kΩ and 100 kΩ, for example. Further, with a 1.4 μm pitch for neighboring TSVs and for neighboring bond pads, examples at this technology node can achieve over 330,000 instances of TSVs and/or bond pads for a serpentine chain test structure implemented across eleven rows of an array of structure regions of a PCM. Such a serpentine chain test structure can have a resistance between 160 kΩ and 300 kΩ, for example. It is contemplated that changes and/or advances in the technology node at which various examples are implemented can achieve different numbers of instances of components within a serpentine chain test structure and/or different resistances. Further, the serpentine chain test structure can be modularized and can be expanded depending on the area of the scribe line.

Figure 5:
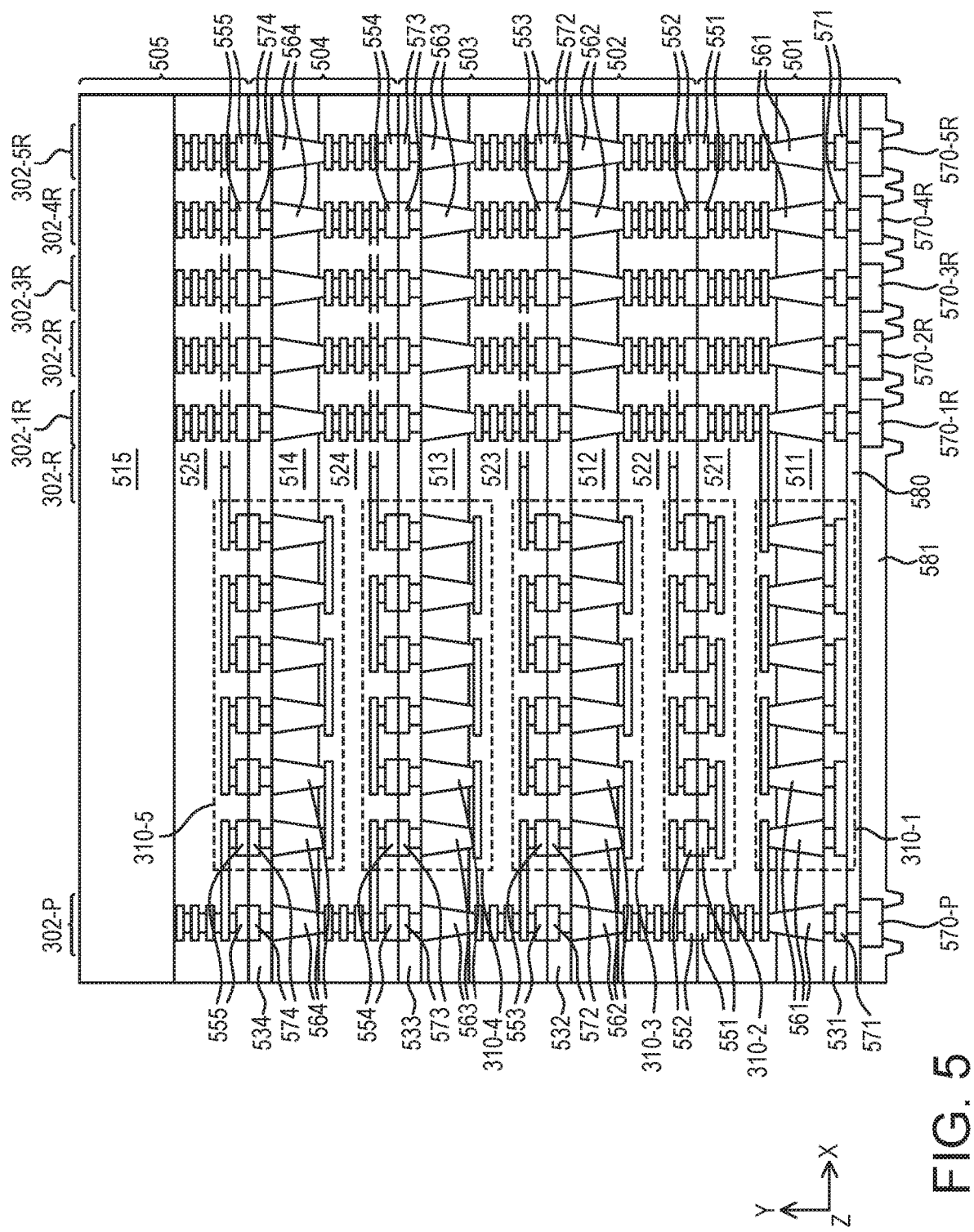
FIG. 5 depicts a simplified cross-section of a stack of bonded wafers that include PCM regions according to some examples.

FIG. 5 depicts a simplified cross-section of a stack of bonded wafers that include PCM regions 106 according to some examples. In view of FIGS. 3 and 4, a person having ordinary skill in the art will readily understand that components (e.g., segments of a serpentine chain test structure) illustrated in FIG. 5 may not be in a same physical cross-section; however, such components are illustrated in such a manner to more clearly illustrate various aspects.

The stack of bonded wafers includes a first tier wafer 501, a second tier wafer 502, a third tier wafer 503, a fourth tier wafer 504, and a fifth tier wafer 505 that are bonded together. In the stack of bonded wafers of FIG. 5, the second, third, fourth, and fifth tier wafers 502-505 are arranged active or front side facing down towards the first tier wafer 501, where the first tier wafer 501 is arranged active or front side facing up towards the second, third, fourth, and fifth tier wafers 502-505. In other stacks, the second, third, and fourth tier wafers 502-504 are arranged active or front side facing up away from the first tier wafer 501, and the fifth tier wafer 505 is arranged active or front side facing down towards the first tier wafer 501, where the first tier wafer 501 is arranged active or front side facing up towards the second, third, fourth, and fifth tier wafers 502-505. Various other stacks of bonded wafers can have different structures, such as a different number of wafers included in the stack.

Each of the wafers 501-505 includes a respective semiconductor substrate 511, 512, 513, 514, 515 and respective front side dielectric layer(s) 521, 522, 523, 524, 525 on a front side of the respective semiconductor substrate 511-515. The front side dielectric layer(s) 521-525 include metallization (e.g., metal lines and/or vias) (illustrated but not specifically numbered) formed therein which can electrically connect various components in an IC. Each of the wafers 501-504 includes respective backside dielectric layer(s) 531, 532, 533, 534 on a backside of the respective semiconductor substrate 511-514. The backside dielectric layer(s) 531-534 include metallization (e.g., metal lines and/or vias) (illustrated but not specifically numbered) formed therein. Each semiconductor substrate 511-514 of the respective wafers 501-504 has backside TSVs 561, 562, 563, 564 therethrough, which can electrically connect the metallization in the front side dielectric layer(s) 521-524 to the metallization in the backside dielectric layer(s) 531-534 of the respective wafer 501-504.

Front side bond pads 551, 552, 553, 554, 555 (e.g., metal (e.g., Cu) bond pads) are formed in the respective front side dielectric layer(s) 521-525 of the wafers 501-505 at an exterior surface distal from the respective semiconductor substrate 511-515. The front side bond pads 551-555 can be in an arrangement that forms a respective die-to-die interface. The front side bond pads 551-555 are connected to the metallization in the respective front side dielectric layer(s) 521-525. Backside pads 571 and backside bond pads 572, 573, 574 (e.g., metal (e.g., Cu) bond pads) are formed in the respective backside dielectric layer(s) 531-534 of the first, second, third, and fourth tier wafers 501-504 at an exterior surface distal from the respective semiconductor substrate 511-514. The backside bond pads 572-574 can be in an arrangement that forms a respective die-to-die interface. The backside pads 571 and backside bond pads 572-574 are connected to the metallization in the respective backside dielectric layer(s) 531-534.

An interior passivation layer 580 is disposed on the backside dielectric layer(s) 531 of the first tier wafer 501. Exterior backside pads 570 (e.g., metal (e.g., aluminum) pads) are formed on and through respective openings of the interior passivation layer and are electrically connected to respective backside pads 571. An exterior passivation layer 581 is disposed on the interior passivation layer 580 and the exterior backside pads 570 with respective openings exposing at least respective portions of the exterior backside pads 570. The exterior backside pads 570 are connected to the metallization, via backside pads 571, in the backside dielectric layer(s) 531 of the first tier wafer 501. The exterior backside pads 570 include a power exterior backside pad 570-P, a first tier return exterior backside pad 570-1R, a second tier return exterior backside pad 570-2R, a third tier return exterior backside pad 570-3R, a fourth tier return exterior backside pad 570-4R, and a fifth tier return exterior backside pad 570-5R, which are aligned in respective PCM regions 106 of the wafers 501-505.

The wafers 501-505 are bonded (e.g., by hybrid bonding using metal-to-metal and oxide-to-oxide bonding) together to form the bonded wafer stack. The first tier wafer 501 is bonded to the second tier wafer 502 front side to front side such that the front side bond pads 551 and exterior surface of the front side dielectric layer(s) 521 of the first tier wafer 501 are bonded to the front side bond pads 552 and exterior surface of the front side dielectric layer(s) 522 of the second tier wafer 502. The second tier wafer 502 is bonded to the third tier wafer 503 backside to front side such that the backside bond pads 572 and exterior surface of the backside dielectric layer(s) 532 of the second tier wafer 502 are bonded to the front side bond pads 553 and exterior surface of the front side dielectric layer(s) 523 of the third tier wafer 503. The third tier wafer 503 is bonded to the fourth tier wafer 504 backside to front side such that the backside bond pads 573 and exterior surface of the backside dielectric layer(s) 533 of the third tier wafer 503 are bonded to the front side bond pads 554 and exterior surface of the front side dielectric layer(s) 524 of the fourth tier wafer 504. The fourth tier wafer 504 is bonded to the fifth tier wafer 505 backside to front side such that the backside bond pads 574 and exterior surface of the backside dielectric layer(s) 534 of the fourth tier wafer 504 are bonded to the front side bond pads 555 and exterior surface of the front side dielectric layer(s) 525 of the fifth tier wafer 505.

Other arrangements of bonding can be implemented. For example, the first tier wafer 501 can be bonded to the second tier wafer 502 front side to backside such that the front side bond pads 551 and exterior surface of the front side dielectric layer(s) 521 of the first tier wafer 501 are bonded to the backside bond pads 572 and exterior surface of the backside dielectric layer(s) 532 of the second tier wafer 502. The second tier wafer 502 can be bonded to the third tier wafer 503 front side to backside such that the front side bond pads 552 and exterior surface of the front side dielectric layer(s) 522 of the second tier wafer 502 are bonded to the backside bond pads 573 and exterior surface of the backside dielectric layer(s) 533 of the third tier wafer 503. The third tier wafer 503 can be bonded to the fourth tier wafer 504 front side to backside such that the front side bond pads 553 and exterior surface of the front side dielectric layer(s) 523 of the third tier wafer 503 are bonded to the backside bond pads 574 and exterior surface of the backside dielectric layer(s) 534 of the fourth tier wafer 504. The fourth tier wafer 504 can be bonded to the fifth tier wafer 505 front side to front side such that the front side bond pads 554 and exterior surface of the front side dielectric layer(s) 524 of the fourth tier wafer 504 are bonded to the front side bond pads 555 and exterior surface of the front side dielectric layer(s) 525 of the fifth tier wafer 505.

Corresponding PCM regions 106 in the wafers 501-505 vertically align (e.g., in a z-direction) when the wafers 501-505 are bonded. The vertical alignment of the PCM regions 106 can cause various structure regions (e.g., chain interconnect regions 302 and DD regions 304) to vertically align. The vertical alignment of chain interconnect regions 302 can cause vertically aligned ones of the chain interconnect regions 302 in the wafers 501-505 to be electrically connected together. As illustrated, a respective metal stack of backside TSVs 561, metal lines, vias, exterior backside pad 570, front side bond pads 551-555, and backside bond pads 572-574 are connected together in the stack of bonded wafers in each vertically aligned power chain interconnect regions 302-P of the wafers 501-505, general return chain interconnect regions 302-R of the wafers 501-505, first die return chain interconnect regions 302-1R of the wafers 501-505, second die return chain interconnect regions 302-2R of the wafers 501-505, third die return chain interconnect regions 302-3R of the wafers 501-505, fourth die return chain interconnect regions 302-4R of the wafers 501-505, and fifth die return chain interconnect regions 302-5R of the wafers 501-505.

A serpentine chain test structure 310-1 is disposed in the first tier wafer 501. The serpentine chain test structure 310-1 is a chain of backside TSVs 561 that are electrically connected in series by metal lines and/or vias in the metallizations in the front side dielectric layer(s) 521 and in the backside dielectric layer(s) 531. The serpentine chain test structure 310-1 is electrically connected between the metal stack in the power chain interconnect region 302-P of the first tier wafer 501 and the metal stack in the first die return chain interconnect region 302-1R of the first tier wafer 501. A metal feature (e.g., a metal line) in the metallizations in the front side dielectric layer(s) 521 electrically connects the serpentine chain test structure 310-1 to the metal stack in the power chain interconnect region 302-P. Similarly, a metal feature (e.g., a metal line) in the metallizations in the front side dielectric layer(s) 521 electrically connects the serpentine chain test structure 310-1 to a metal line and/or metal stack in the general return chain interconnect region 302-R of the first tier wafer 501, which metal line and/or metal stack is then electrically connected by the return interconnect 306 (e.g., a metal line in the metallizations in the front side dielectric layer(s) 521) to the metal stack in the first die return chain interconnect region 302-1R.

A serpentine chain test structure 310-2 is disposed at least partially in the first tier wafer 501 and at least partially in the second tier wafer 502. The serpentine chain test structure 310-2 is a chain of bonded bond pads 551, 552 that are electrically connected in series by metal lines and/or vias in the metallizations in the front side dielectric layer(s) 521 of the first tier wafer 501 and in the front side dielectric layer(s) 522 in the second tier wafer 502. The serpentine chain test structure 310-2 is formed at least in part by bonding the first tier wafer 501 to the second tier wafer 502 (e.g., bonding ones of the front side bond pads 551 to respective ones of the front side bond pads 552). The serpentine chain test structure 310-2 is electrically connected between the metal stack in the power chain interconnect region 302-P of the second tier wafer 502 and the metal stack in the second die return chain interconnect region 302-2R of the second tier wafer 502. A metal feature (e.g., a metal line) in the metallizations in the front side dielectric layer(s) 522 electrically connects the serpentine chain test structure 310-2 to the metal stack in the power chain interconnect region 302-P. Similarly, a metal feature (e.g., a metal line) in the metallizations in the front side dielectric layer(s) 522 electrically connects the serpentine chain test structure 310-2 to a metal line and/or metal stack in the general return chain interconnect region 302-R of the second tier wafer 502, which metal line and/or metal stack is then electrically connected by the return interconnect 306 (e.g., a metal line in the metallizations in the front side dielectric layer(s) 522) to the metal stack in the second die return chain interconnect region 302-2R.

A serpentine chain test structure 310-3 is disposed at least partially in the second tier wafer 502 and at least partially in the third tier wafer 503. The serpentine chain test structure 310-3 is a chain of bonded bond pads 572, 553 and backside TSVs 562 that are electrically connected in series by metal lines and/or vias in the metallizations in the front side dielectric layer(s) 522 of the second tier wafer 502 and in the front side dielectric layer(s) 523 in the third tier wafer 503. The serpentine chain test structure 310-3 is formed at least in part by bonding the second tier wafer 502 to the third tier wafer 503 (e.g., bonding ones of the backside bond pads 572 to respective ones of the front side bond pads 553). The serpentine chain test structure 310-3 is electrically connected between the metal stack in the power chain interconnect region 302-P of the third tier wafer 503 and the metal stack in the third die return chain interconnect region 302-3R of the third tier wafer 503. A metal feature (e.g., a metal line) in the metallizations in the front side dielectric layer(s) 523 electrically connects the serpentine chain test structure 310-3 to the metal stack in the power chain interconnect region 302-P. Similarly, a metal feature (e.g., a metal line) in the metallizations in the front side dielectric layer(s) 523 electrically connects the serpentine chain test structure 310-3 to a metal line and/or metal stack in the general return chain interconnect region 302-R of the third tier wafer 503, which metal line and/or metal stack is then electrically connected by the return interconnect 306 (e.g., a metal line in the metallizations in the front side dielectric layer(s) 523) to the metal stack in the third die return chain interconnect region 302-3R.

A serpentine chain test structure 310-4 is disposed at least partially in the third tier wafer 503 and at least partially in the fourth tier wafer 504. The serpentine chain test structure 310-4 is a chain of bonded bond pads 573, 554 and backside TSVs 563 that are electrically connected in series by metal lines and/or vias in the metallizations in the front side dielectric layer(s) 523 of the third tier wafer 503 and in the front side dielectric layer(s) 524 in the fourth tier wafer 504. The serpentine chain test structure 310-4 is formed at least in part by bonding the third tier wafer 503 to the fourth tier wafer 504 (e.g., bonding ones of the backside bond pads 573 to respective ones of the front side bond pads 554). The serpentine chain test structure 310-4 is electrically connected between the metal stack in the power chain interconnect region 302-P of the fourth tier wafer 504 and the metal stack in the fourth die return chain interconnect region 302-4R of the fourth tier wafer 504. A metal feature (e.g., a metal line) in the metallizations in the front side dielectric layer(s) 524 electrically connects the serpentine chain test structure 310-4 to the metal stack in the power chain interconnect region 302-P. Similarly, a metal feature (e.g., a metal line) in the metallizations in the front side dielectric layer(s) 524 electrically connects the serpentine chain test structure 310-4 to a metal line and/or metal stack in the general return chain interconnect region 302-R of the fourth tier wafer 504, which metal line and/or metal stack is then electrically connected by the return interconnect 306 (e.g., a metal line in the metallizations in the front side dielectric layer(s) 524) to the metal stack in the fourth die return chain interconnect region 302-4R.

A serpentine chain test structure 310-5 is disposed at least partially in the fourth tier wafer 504 and at least partially in the fifth tier wafer 505. The serpentine chain test structure 310-5 is a chain of bonded bond pads 574, 555 and backside TSVs 564 that are electrically connected in series by metal lines and/or vias in the metallizations in the front side dielectric layer(s) 524 of the fourth tier wafer 504 and in the front side dielectric layer(s) 525 in the fifth tier wafer 505. The serpentine chain test structure 310-5 is formed at least in part by bonding the fourth tier wafer 504 to the fifth tier wafer 505 (e.g., bonding ones of the backside bond pads 574 to respective ones of the front side bond pads 555). The serpentine chain test structure 310-5 is electrically connected between the metal stack in the power chain interconnect region 302-P of the fifth tier wafer 505 and the metal stack in the fifth die return chain interconnect region 302-5R of the fifth tier wafer 505. A metal feature (e.g., a metal line) in the metallizations in the front side dielectric layer(s) 525 electrically connects the serpentine chain test structure 310-5 to the metal stack in the power chain interconnect region 302-P. Similarly, a metal feature (e.g., a metal line) in the metallizations in the front side dielectric layer(s) 525 electrically connects the serpentine chain test structure 310-5 to a metal line and/or metal stack in the general return chain interconnect region 302-R of the fifth tier wafer 505, which metal line and/or metal stack is then electrically connected by the return interconnect 306 (e.g., a metal line in the metallizations in the front side dielectric layer(s) 525) to the metal stack in the fifth die return chain interconnect region 302-5R.

Figure 6:
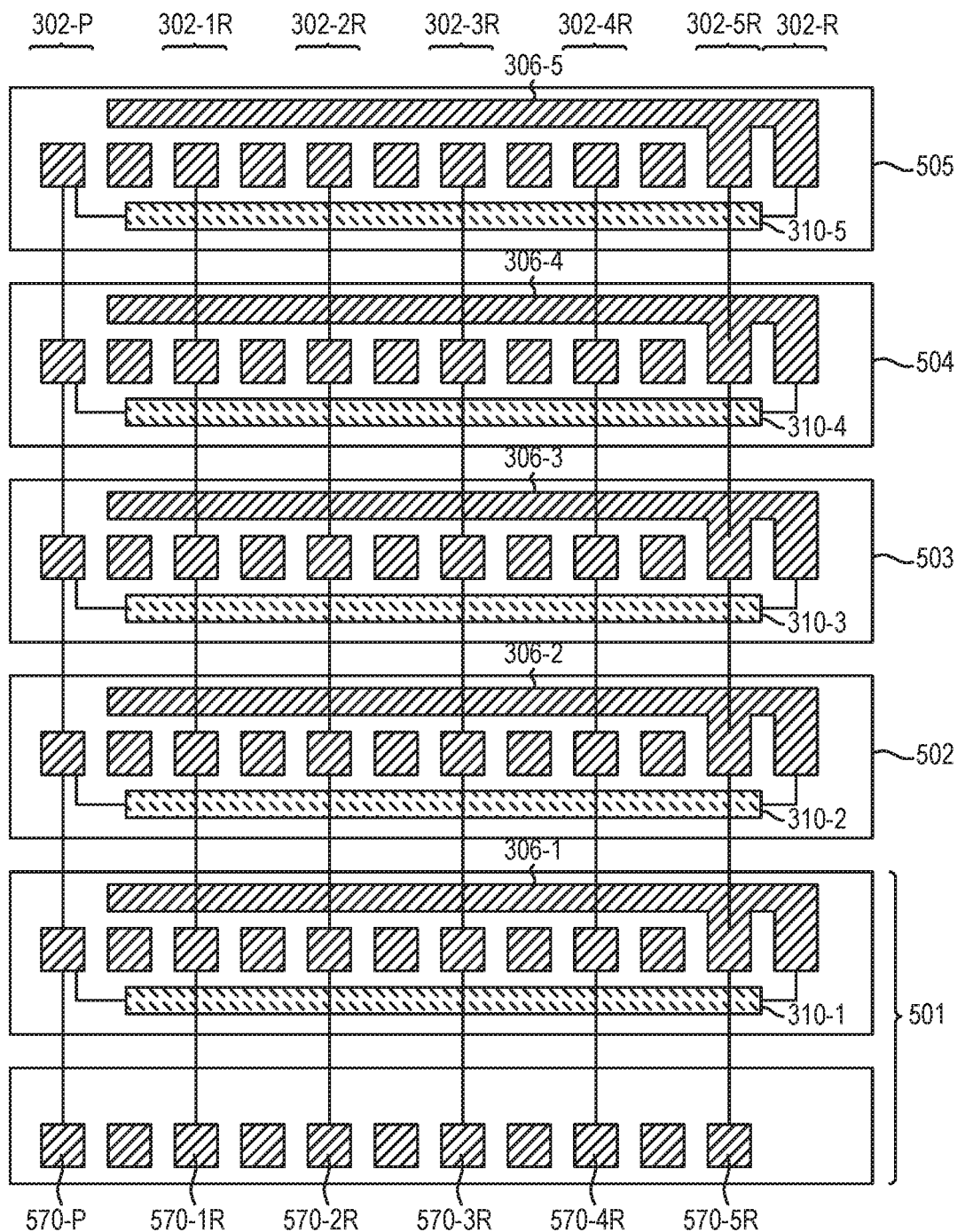
FIG. 6 depicts a schematic of the cross-section of the stack of bonded wafers that include PCM regions of FIG. 5 to illustrate test loops according to some examples.

FIG. 6 illustrates a schematic of the cross-section of the stack of bonded wafers that include PCM regions 106 of FIG. 5 to illustrate test loops (e.g., electrical paths) according to some examples. FIG. 6 depicts a row of the array of a PCM region 106 for each wafer 501-505 that corresponds to the row of the PCM region 106 of FIG. 3 that includes the chain interconnect regions 302. Although the various serpentine chain test structures 310 are schematically shown in FIG. 6 to be in a given wafer, any of the serpentine chain test structures 310 can be formed disposed across, e.g., two wafers like illustrated in FIG. 5. The serpentine chain test structures 310 are shown to illustrate in which wafer the respective serpentine chain test structure 310 is electrically connected between a metal stack in the power chain interconnect region 302-P and a metal line and/or metal stack in the general return chain interconnect region 302-R.

Referring to FIGS. 5 and 6, to test the bonded wafer stack, a probe card probes the exterior backside pads 570. The probe card applies power to the power exterior backside pad 570-P. The probe card can detect a signal from the first tier return exterior backside pad 570-1R indicative of one or more characteristics of the serpentine chain test structure 310-1. A path can be formed from the power exterior backside pad 570-P, through the metal stack of the power chain interconnect region 302-P of the first tier wafer 501, the serpentine chain test structure 310-1, the metal line and/or metal stack in the general return chain interconnect region 302-R of the first tier wafer 501, the return interconnect 306-1 in the first tier wafer 501, and the metal stack in the first die return chain interconnect region 302-1R of the first tier wafer 501, and to the first tier return exterior backside pad 570-1R. Any voltage or current of the signal detected by the probe card at the first tier return exterior backside pad 570-1R can indicate connectivity of the serpentine chain test structure 310-1. If, e.g., a misalignment in fabrication of the first tier wafer 501 occurred, the series connections of the serpentine chain test structure 310-1 could be broken, which would result in no current flowing through the serpentine chain test structure 310-1 that could be detected at the first tier return exterior backside pad 570-1R. Additionally, detecting a voltage drop between the power exterior backside pad 570-P and the first tier return exterior backside pad 570-1R and a current flowing from the first tier return exterior backside pad 570-1R can be used to determine a resistance of the electrical path. Connectivity and resistance can be determined for other serpentine chain test structures 310 described below, as a person having ordinary skill in the art will readily understand.

The probe card can detect a signal from the second tier return exterior backside pad 570-2R indicative of one or more characteristics of the serpentine chain test structure 310-2. A path can be formed from the power exterior backside pad 570-P, through the metal stack of the power chain interconnect region 302-P of the first and second tier wafers 501-502, the serpentine chain test structure 310-2, the metal line and/or metal stack in the general return chain interconnect region 302-R of the second tier wafer 502, the return interconnect 306-2 in the second tier wafer 502, and the metal stack in the second die return chain interconnect region 302-2R of the first and second tier wafers 501-502, and to the second tier return exterior backside pad 570-2R.

The probe card can detect a signal from the third tier return exterior backside pad 570-3R indicative of one or more characteristics of the serpentine chain test structure 310-3. A path can be formed from the power exterior backside pad 570-P, through the metal stack of the power chain interconnect region 302-P of the first, second, and third tier wafers 501-503, the serpentine chain test structure 310-3, the metal line and/or metal stack in the general return chain interconnect region 302-R of the third tier wafer 503, the return interconnect 306-3 in the third tier wafer 503, and the metal stack in the third die return chain interconnect region 302-3R of the first, second, and third tier wafers 501-503, and to the third tier return exterior backside pad 570-3R.

The probe card can detect a signal from the fourth tier return exterior backside pad 570-4R indicative of one or more characteristics of the serpentine chain test structure 310-4. A path can be formed from the power exterior backside pad 570-P, through the metal stack of the power chain interconnect region 302-P of the first, second, third, and fourth tier wafers 501-504, the serpentine chain test structure 310-4, the metal line and/or metal stack in the general return chain interconnect region 302-R of the fourth tier wafer 504, the return interconnect 306-4 in the fourth tier wafer 504, and the metal stack in the fourth die return chain interconnect region 302-4R of the first, second, third, and fourth tier wafers 501-504, and to the fourth tier return exterior backside pad 570-4R.

The probe card can detect a signal from the fifth tier return exterior backside pad 570-5R indicative of one or more characteristics of the serpentine chain test structure 310-5. A path can be formed from the power exterior backside pad 570-P, through the metal stack of the power chain interconnect region 302-P of the first, second, third, fourth, and fifth tier wafers 501-505, the serpentine chain test structure 310-5, the metal line and/or metal stack in the general return chain interconnect region 302-R of the fifth tier wafer 505, the return interconnect 306-5 in the fifth tier wafer 505, and the metal stack in the fifth die return chain interconnect region 302-5R of the first, second, third, fourth, and fifth tier wafers 501-505, and to the fifth tier return exterior backside pad 570-5R.

Figure 7:
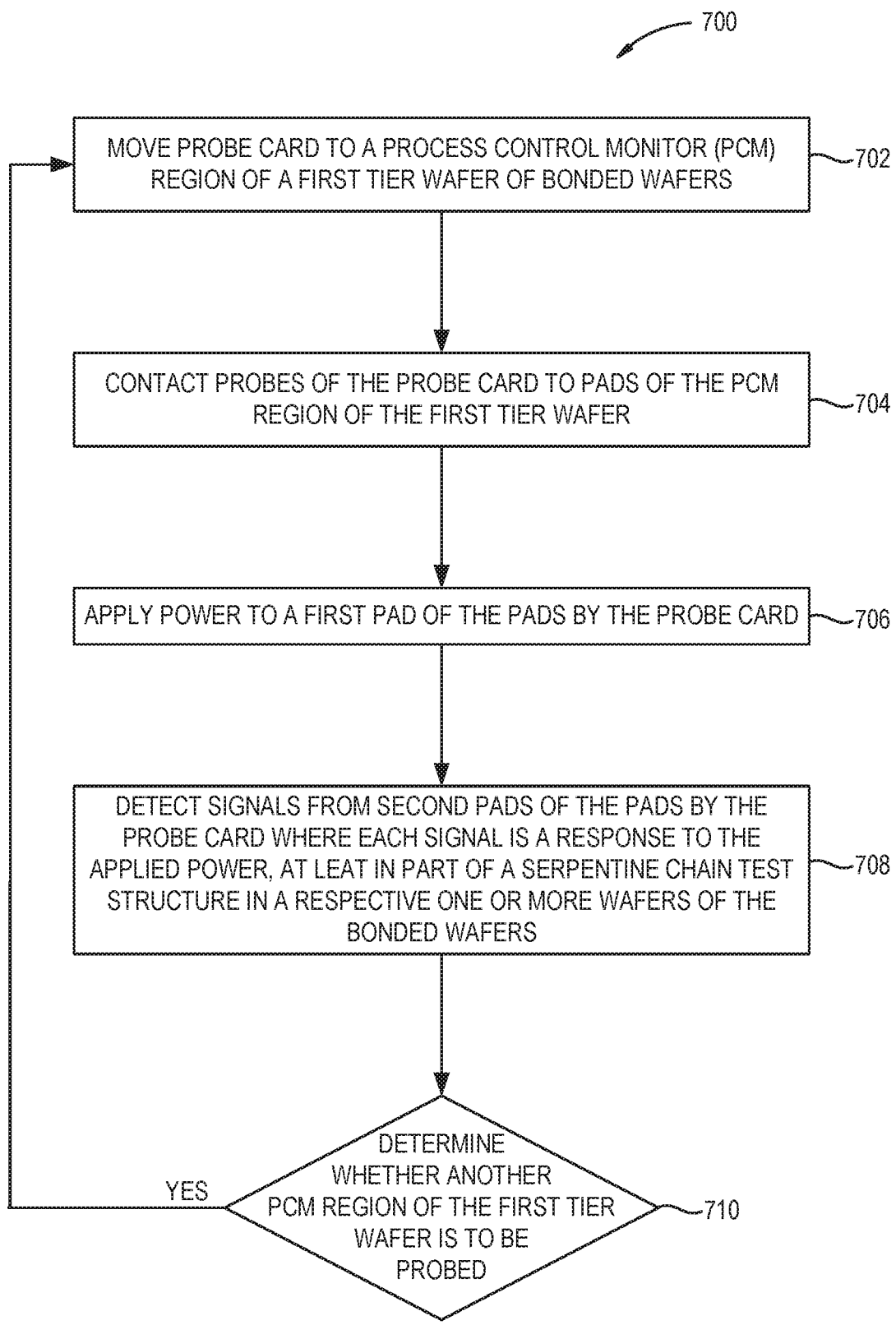
FIG. 7 is a flowchart of a method of performing testing of bonded wafers according to some examples.

FIG. 7 is a flowchart of a method 700 of performing testing of bonded wafers according to some examples. The method 700 of FIG. 7 is described in the context of the examples of preceding figures for clarity, although the method 700 can be practiced with other examples.

At block 702, a probe card is moved (e.g., stepped) to a PCM region of a first tier wafer of the bonded wafers. For example, the probe card can be moved to any PCM region 106 of the first tier wafer 501.

At block 704, probes of the probe card contact pads of the PCM region of the first tier wafer. Like described above, probes of the probe card can contact the exterior backside pads 570 in the PCM region 106 of the first tier wafer 501.

At block 706, power is applied to a first pad of the pads by the probe card. For example, power can be applied to the power exterior backside pad 570-P in the PCM region 106 of the first tier wafer 501. The power may be in the form of, e.g., a current source or a voltage source.

At block 708, signals are detected from second pads of the pads by the probe card. Each signal detected from a respective second pad is a response to the applied power, at least in part, of a serpentine chain test structure in a respective one or more wafers of the bonded wafers. For example, as described above with respect to FIGS. 5 and 6, the probe card can detect a signal from the first tier return exterior backside pad 570-1R that is a response, at least in part, of the serpentine chain test structure 310-1 to power applied by the probe card to the power exterior backside pad 570-P. The probe card can detect a signal from the second tier return exterior backside pad 570-2R that is a response, at least in part, of the serpentine chain test structure 310-2 to power applied by the probe card to the power exterior backside pad 570-P. The probe card can detect a signal from the third tier return exterior backside pad 570-3R that is a response, at least in part, of the serpentine chain test structure 310-3 to power applied by the probe card to the power exterior backside pad 570-P. The probe card can detect a signal from the fourth tier return exterior backside pad 570-4R that is a response, at least in part, of the serpentine chain test structure 310-4 to power applied by the probe card to the power exterior backside pad 570-P. The probe card can detect a signal from the fifth tier return exterior backside pad 570-5R that is a response, at least in part, of the serpentine chain test structure 310-5 to power applied by the probe card to the power exterior backside pad 570-P. Each signal can indicate, e.g., a misalignment of TSV, pad, via, or metal line that breaks the electrical loop (e.g., such that the signal is no voltage and no current detected at the pad) or can indicate a resistance of the serpentine chain test structure.

At block 710, a determination is made whether another PCM region of the first tier wafer is to be probed. If so, the probe card is moved to that PCM region, at block 702, and the performance of the blocks continues as described above. This loop may continue until all of the PCM regions on the first tier wafer have been probed.

The signals obtained by the testing can be compared against a design specification. If the signals are within the design specification, the stack of bonded wafers that is tested can be accepted and used for subsequent processing (e.g., singulation and packaging). If the signals are not within the design specification, the stack of bonded wafers that is tested can be discarded.

Figure 8:
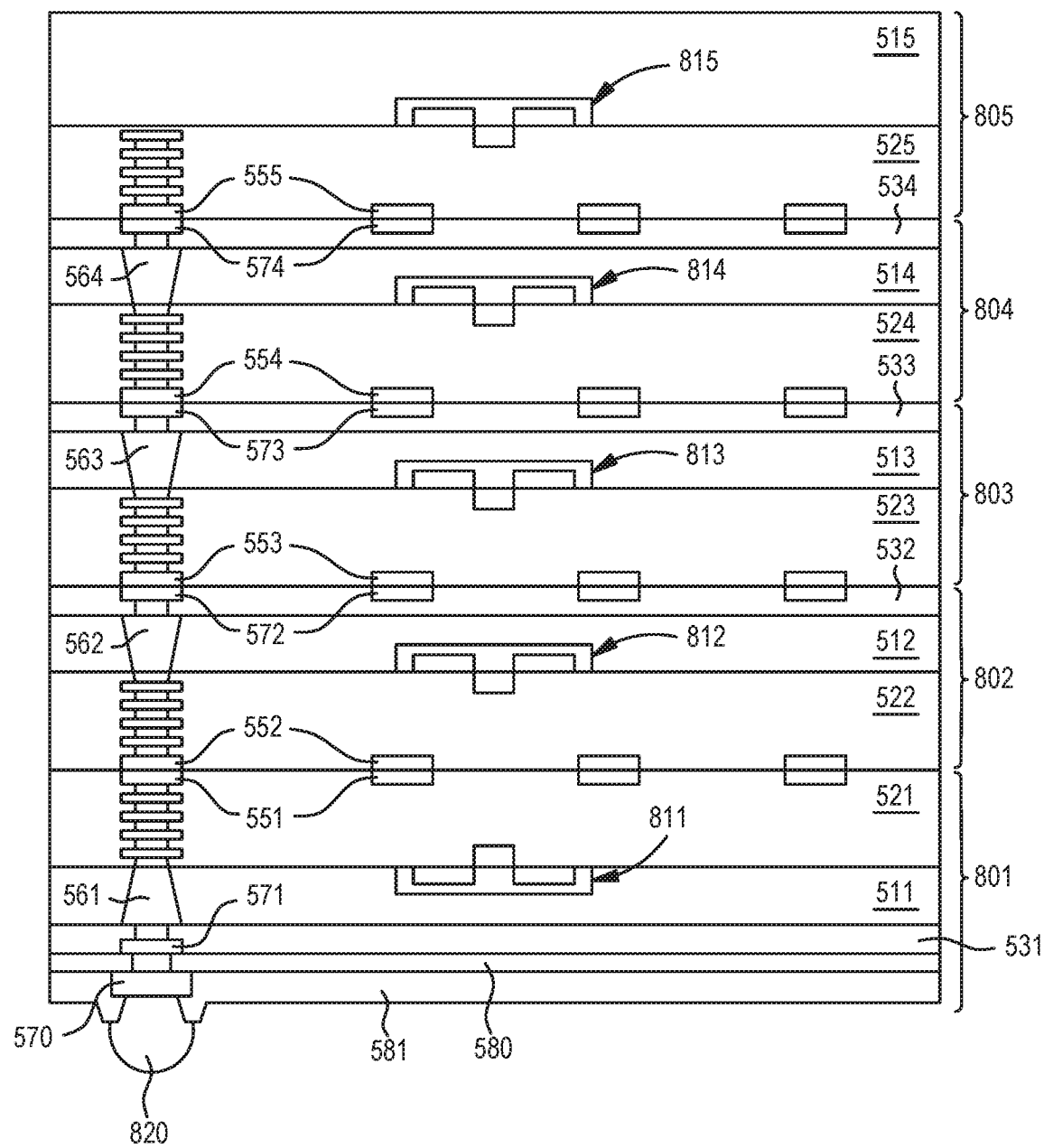
FIG. 8 is a structure of a multi-die device according to some examples.

FIG. 8 is a structure of a multi-die device according to some examples. The multi-die device of FIG. 8 includes an IC die stack that includes a base IC die 801, intermediate IC dies 802, 803, 804, and a distal IC die 805. The base IC die 801, intermediate IC dies 802-804, and distal IC die 805 are described herein as examples. Aspects described herein can be generally applicable to IC dies of a multi-die device having any type of IC or component.

The multi-die device is singulated from the stack of bonded wafer illustrated in and described with respect to FIG. 5. The base IC die 801 is an IC die formed in the first tier wafer 501. The intermediate IC die 802 is an IC die formed in the second tier wafer 502. The intermediate IC die 803 is an IC die formed in the third tier wafer 503. The intermediate IC die 802 is an IC die formed in the fourth tier wafer 504. The distal IC die 805 is an IC die formed in the fifth tier wafer 505. Like numbering of the same components is used in FIG. 8 as is used in FIG. 5. For brevity of description, redundant description of such components is omitted here.

Generally, the IC dies 801-805 are stacked and form an IC die stack in the multi-die device. The IC dies 801-805 are stacked to form, in some examples, an Active die-on-Active die (AoA) device. Each of the IC dies 801-805 can include an active IC. In some examples, more or fewer IC dies can be included in the IC die stack, such as if more or fewer wafers are included in the stack of bonded wafers. For example, a multi-die device can have two IC dies (such as a base IC die and a distal IC die), can have three IC dies (such as a base IC die, an intermediate IC die, and a distal IC die), or can have four or more IC dies (such as a base IC die, two or more intermediate IC dies, and a distal IC die). In some examples, a multi-die device can have three IC dies, four IC dies, five IC dies, etc.

Each semiconductor substrate 511-515 of the IC dies 801-805 includes devices, e.g., a transistor 811, 812, 813, 814, 815, formed on and/or in the front side surface of the respective semiconductor substrate 511-515. The transistor 811-815 and any other devices or components within a respective IC die 801-805 can be connected to the metallization in the front side dielectric layer(s) 521-525. The electrical connections to devices formed on and/or in the semiconductor substrates 511-515 by metallizations in front side dielectric layer(s) 521-525, metallizations in backside dielectric layer(s) 531-535, and/or backside TSVs 561-564 can form a respective IC with those devices.

External connectors 820 (e.g., controlled collapse chip connections (C4), minibumps, etc.) are formed disposed on respective exterior backside pads 570 through the openings in the exterior passivation layer 581. The external connectors 820 can be attached to a package substrate. The package substrate may further be attached to, e.g., a printed circuit board (PCB) to attach the package substrate (and hence, the multi-die device) to the PCB. Various other components can be included in a multi-die device. For example, an interposer, an encapsulant (such as a molding compound (MUF) or the like), etc. can be included in the multi-die device. A person having ordinary skill in the art will readily envision various modifications that can be made to the multi-die device.

In some examples, the base IC die 801 includes an interconnect that is capable of transmitting signals generally horizontally (e.g., parallel to the front side surface of the semiconductor substrate 511). The interconnect can be electrically and communicatively coupled to the other IC dies of the IC die stack. Signals can be transmitted in the interconnect of the base IC die 801 and then vertically (through metallizations and TSVs of various IC dies) to an appropriate target IC die in the IC die stack. Additionally, the base IC die 801 includes appropriate input/output circuits for receiving signals from a source and/or transmitting signals to a destination outside of the IC die stack of the multi-die device. The base IC die 801 can further include other circuits. For example, the base IC die 801 can be or include a processing IC and may further be a System-on-Chip (SoC).

In some examples, each of the intermediate IC dies 802-804, and distal IC die 805 includes a processing IC (such as a fabric IC and compute IC). A processing IC can generally include any circuit configured to or configurable to process any data and/or signal and output data and/or a signal resulting from that processing, and is more than merely memory and any circuit ancillary to memory (e.g., address decoder, memory controller, etc.). The processing IC of the intermediate IC dies 802-804 can be a same IC in some examples. The hardware topology, architecture, and layout of the intermediate IC dies 802-804 can be the same in some examples. In some examples, the processing IC of the intermediate IC dies 802-804 includes one or more programmable logic regions (e.g., fabric of a field programmable gate array (FPGA)), which has the same hardware topology, architecture, and layout between the intermediate IC dies 802-804. In other examples, the intermediate IC dies 802-804 are different ICs.

The distal IC die 805 can be or include any IC. For example, the distal IC die 805 can be or include a processing IC or memory. In some examples, the distal IC die 805 is an application specific IC (ASIC). In some examples, the distal IC die 805 is a same processing IC as one or all of the intermediate IC dies 802-804 except without, e.g., TSVs and backside dielectric layer(s) and metallizations therein. In other examples, the intermediate IC dies 802-804 and distal IC die 805 can each be a different IC. In still other examples, the IC dies 802-805 can each be or include any permutation of being or including a same IC and/or different ICs. Any intermediate IC die 802-804 or distal IC die 805 may generically be referred to as an active IC die.

Figure 9:
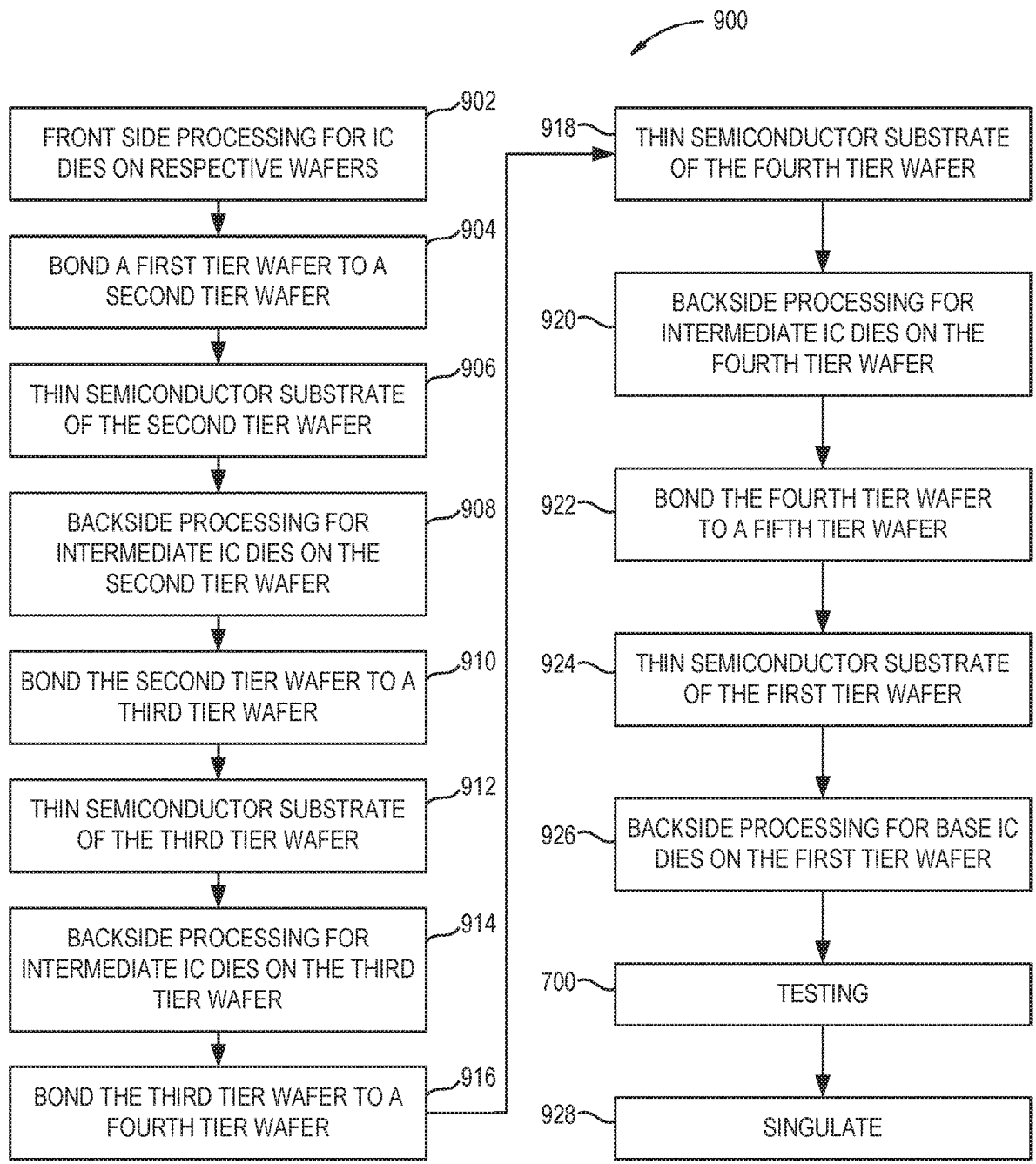
FIG. 9 is a flowchart of a method of forming the multi-die device of FIG. 8 according to some examples.

FIG. 9 is a flowchart of a method 900 of forming the multi-die device of FIG. 8 according to some examples. A person having ordinary skill in the art will readily understand modifications to achieve other multi-die devices. The processing of the method 900 of FIG. 9 is generally described, and a person having ordinary skill in the art will readily understand the more specific processing that can be performed. The more specific processing can be according to any semiconductor processing for forming an IC on a substrate, which is to be singulated into an IC die.

As indicated by the foregoing, the method 900 of FIG. 9 includes forming a stack of bonded wafers as illustrated in and described with respect to FIG. 5. The multi-die device of FIG. 8 is then formed by singulating the IC dies in the stack of bonded wafers. Aspects of the method 900 described below are described in the context of FIGS. 5 and 8.

At block 902, front side processing for IC dies on the respective wafers is performed. For example, front side processing of each semiconductor substrate 511-515 can include forming devices (e.g., transistors 811-815) in and/or on the front surface of the semiconductor substrate 511-515, and forming front side dielectric layer(s) 521-525 with metallizations and front side bond pads 551-555 on the front surface of the semiconductor substrate 511-515. Multiple base IC dies 801 can be formed on a first tier wafer 501. Multiple intermediate IC dies 802 can be formed on a second tier wafer 502. Multiple intermediate IC dies 803 can be formed on a third tier wafer 503. Multiple intermediate IC dies 804 can be formed on a fourth tier wafer 504. Multiple distal IC dies 805 can be formed on a fifth tier wafer 505. Each of the wafers can generally have a layout as shown in FIG. 1 and can include PCM regions 106 in scribe lines for testing. Examples of the PCM regions 106 are described above.

At block 904, a first tier wafer is bonded to a second tier wafer, such as front side to front side bonding as shown in FIGS. 5 and 8. As a result of the bonding, a front side of a base IC die 801 is bonded to a front side of an intermediate IC die 802, as shown in FIG. 8. The bonding can be hybrid bonding, such as bonding front side bond pads 551 on the first tier wafer to front side bond pads 552 on the second tier wafer, and bonding the exterior surface of the front side dielectric layer(s) 521 on the first tier wafer to the exterior surface of the front side dielectric layer(s) 522 on the second tier wafer.

At block 906, the semiconductor substrate of the second tier wafer is thinned from a backside of the second tier wafer. As show in FIGS. 5 and 8, the semiconductor substrate 512 of the second tier wafer 502 is thinned from the backside. The thinning can be by a chemical mechanical polish (CMP) or other appropriate process. At block 908, backside processing for intermediate IC dies on the second tier wafer is performed. As illustrated by FIGS. 5 and 8, the backside processing can include forming backside TSVs 562 through the semiconductor substrate 512 of the second tier wafer 502 and connecting to metallization in the front side dielectric layer(s) 522 on the second tier wafer 502. The backside processing can further include forming backside dielectric layer(s) 532 with metallizations and backside bond pads 572 on the backside of the semiconductor substrate 512. The metallizations in the backside dielectric layer(s) 532 can be connected to the metallizations in the front side dielectric layer(s) 522 through the backside TSVs 562.

At block 910, the second tier wafer is bonded to a third tier wafer, such as backside to front side bonding as shown in FIGS. 5 and 8. As a result of the bonding, a backside of an intermediate IC die 802 is bonded to a front side of an intermediate IC die 803, as shown in FIG. 8. The bonding can be hybrid bonding, such as bonding backside bond pads 572 on the second tier wafer 502 to front side bond pads 553 on the third tier wafer 503, and bonding the exterior surface of the backside dielectric layer(s) 532 on the second tier wafer 502 to the exterior surface of the front side dielectric layer(s) 523 on the third tier wafer 503.

At block 912, the semiconductor substrate of the third tier wafer is thinned from a backside of the third tier wafer, like described with respect to block 906. As show in FIGS. 5 and 8, the semiconductor substrate 513 of the third tier wafer 503 is thinned from the backside.

At block 914, backside processing for intermediate IC dies on the third tier wafer is performed, like described with respect to block 908. As illustrated by FIGS. 5 and 8, the backside processing can include forming backside TSVs 563 through the semiconductor substrate 513 of the third tier wafer 503 and connecting to metallization in the front side dielectric layer(s) 523 on the third tier wafer 503. The backside processing can further include forming backside dielectric layer(s) 533 with metallizations and backside bond pads 573 on the backside of the semiconductor substrate 513. The metallizations in the backside dielectric layer(s) 533 can be connected to the metallizations in the front side dielectric layer(s) 523 through the backside TSVs 563.

At block 916, the third tier wafer is bonded to a fourth tier wafer, such as backside to front side bonding as shown in FIGS. 5 and 8. As a result of the bonding, a backside of an intermediate IC die 803 is bonded to a front side of an intermediate IC die 804, as shown in FIG. 8. The bonding can be hybrid bonding, such as bonding backside bond pads 573 on the third tier wafer 503 to front side bond pads 554 on the fourth tier wafer 504, and bonding the exterior surface of the backside dielectric layer(s) 533 on the third tier wafer 503 to the exterior surface of the front side dielectric layer(s) 524 on the fourth tier wafer 504.

At block 918, the semiconductor substrate of the fourth tier wafer is thinned from a backside of the fourth tier wafer, like described with respect to block 906. As show in FIGS. 5 and 8, the semiconductor substrate 514 of the fourth tier wafer 504 is thinned from the backside.

At block 920, backside processing for intermediate IC dies on the fourth tier wafer is performed, like described with respect to block 908. As illustrated by FIGS. 5 and 8, the backside processing can include forming backside TSVs 564 through the semiconductor substrate 514 of the fourth tier wafer 504 and connecting to metallization in the front side dielectric layer(s) 524 on the fourth tier wafer 504. The backside processing can further include forming backside dielectric layer(s) 534 with metallizations and backside bond pads 574 on the backside of the semiconductor substrate 514. The metallizations in the backside dielectric layer(s) 534 can be connected to the metallizations in the front side dielectric layer(s) 524 through the backside TSVs 564.

At block 922, the fourth tier wafer is bonded to a fifth tier wafer, such as backside to front side bonding as shown in FIGS. 5 and 8. As a result of the bonding, a backside of an intermediate IC die 804 is bonded to a front side of a distal IC die 805, as shown in FIG. 8. The bonding can be hybrid bonding, such as bonding backside bond pads 574 on the fourth tier wafer 504 to front side bond pads 555 on the fifth tier wafer 505, and bonding the exterior surface of the backside dielectric layer(s) 534 on the fourth tier wafer 504 to the exterior surface of the front side dielectric layer(s) 525 on the fifth tier wafer 505.

At block 924, the semiconductor substrate of the first tier wafer is thinned from a backside of the first tier wafer, like described with respect to block 906. As show in FIGS. 5 and 8, the semiconductor substrate 511 of the first tier wafer 501 is thinned from the backside.

At block 926, backside processing for base IC dies on the first tier wafer is performed, like described with respect to block 908. As illustrated by FIGS. 5 and 8, the backside processing can include forming backside TSVs 561 through the semiconductor substrate 511 of the first tier wafer 501 and connecting to metallization in the front side dielectric layer(s) 521 on the first tier wafer 501. The backside processing can further include forming backside dielectric layer(s) 531 with metallizations and backside pads 571 on the backside of the semiconductor substrate 511. The metallizations in the backside dielectric layer(s) 531 can be connected to the metallizations in the front side dielectric layer(s) 521 through the backside TSVs 561. The backside processing for the first tier wafer 501 can further include forming the interior passivation layer 580 with openings to the backside pads 571, forming the exterior backside pads 570 on the interior passivation layer 580 and through the openings to connect to the backside pads 571, and forming the exterior passivation layer 581 with openings to the exterior backside pads 570.

At method 700, testing of the stack of bonded wafers is performed, as described above. Signals can be obtained and analyzed. Results of the testing can be compared to a design specification. Any stack of bonded wafers having results that do not meet the design specification can be discarded. Any stack of bonded wafers having results within the design specification can be continued to be processed.

At block 928, the bonded wafers are singulated by dicing (e.g., by sawing) along the scribe lines of the wafers to separate individual multi-die devices that have been formed. Each of the multi-die devices can be as shown in FIG. 8. In some examples, external connectors 820 can be formed on the exterior backside pads 570 after testing and prior to singulation.

The various operations of blocks of the method 900 can be repeated and/or omitted to form various multi-die devices. The method 900 has been provided as an example of how some multi-die devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-die devices. A person having ordinary skill in the art will readily understand how to form other multi-die devices based on the description of the method 900 above.

While the foregoing is directed to specific examples, other and further examples may be devised without departing from the basic scope thereof, and the scope thereof is determined by the claims that follow.

What is claimed is:

1. A method for testing, the method comprising:
    applying power to a first pad on a stack of bonded wafers, a first wafer of the stack of bonded wafers including a first process control monitor region, the first process control monitor region including first structure regions in the first wafer, each first structure region of the first structure regions being a device under test region, a dummy region, a chain interconnect region, or a combination thereof, the stack of bonded wafers including a first serpentine chain test structure electrically connected between a first metal feature in the first wafer in a first chain interconnect region in the first process control monitor region and a second metal feature in the first wafer in a second chain interconnect region in the first process control monitor region, the first serpentine chain test structure including first segments, one or more segments of the first segments being disposed between neighboring first structure regions in the first process control monitor region that are not the first chain interconnect region and the second chain interconnect region, the first pad being electrically connected to the first metal feature; and
    detecting a first signal from a second pad on the stack of bonded wafers, the second pad being electrically connected to the second metal feature, the first signal being a response of, at least in part, the first serpentine chain test structure to the applied power.

2. The method of claim 1, wherein the first structure regions are arranged in an array, the first chain interconnect region and the second chain interconnect region being disposed in a same row of the array, the one or more segments of the first segments being disposed between first structure regions that are in neighboring columns of the array and that are in one or more rows of the array different from the row of the array in which the first chain interconnect region and the second chain interconnect region are disposed.

3. The method of claim 1, wherein the first serpentine chain test structure includes serially connected through-substrate vias (TSVs) disposed in a semiconductor substrate of the first wafer.

4. The method of claim 1, wherein the first serpentine chain test structure includes serially connected through-substrate vias (TSVs) disposed in a semiconductor substrate of a second wafer bonded to the first wafer.

5. The method of claim 1, wherein the first serpentine chain test structure includes first bond pads on the first wafer and second bond pads on a second wafer bonded to the first wafer, ones of the first bond pads being bonded to respective ones of the second bond pads, bonded pairs of the first bond pads and the second bond pads being serially connected.

6. The method of claim 1, wherein the first serpentine chain test structure includes:
    first bond pads on the first wafer and second bond pads on a second wafer bonded to the first wafer, ones of the first bond pads being bonded to respective ones of the second bond pads; and
    through-substrate vias (TSVs) disposed in a semiconductor substrate of the first wafer or the second wafer, the TSVs and bonded pairs of the first bond pads and the second bond pads being serially connected.

7. The method of claim 1, wherein:
    a first metal stack extends from the first pad across the stack of bonded wafers, the first metal feature in the first wafer being in the first metal stack; and
    a second metal stack extends from the second pad across the stack of bonded wafers, the second metal feature in the first wafer being in the second metal stack.

8. The method of claim 1 further comprising detecting a second signal from a third pad on the stack of bonded wafers, the stack of bonded wafers including a second wafer distinct from the first wafer, the second wafer including a second process control monitor region, the second process control monitor region including second structure regions in the second wafer, each second structure region of the second structure regions being a device under test region, a dummy region, a chain interconnect region, or a combination thereof, the stack of bonded wafers including a second serpentine chain test structure electrically connected between a third metal feature in the second wafer in a third chain interconnect region in the second process control monitor region and a fourth metal feature in the second wafer in a fourth chain interconnect region in the second process control monitor region, the second serpentine chain test structure including second segments, one or more segments of the second segments being disposed between respective neighboring second structure regions in the second process control monitor region that are not the third chain interconnect region and the fourth chain interconnect region, the first pad being electrically connected to the third metal feature, the third pad being electrically connected to the fourth metal feature, the second signal being a response of, at least in part, the second serpentine chain test structure to the applied power.

9. The method of claim 8, wherein:
    a first metal stack extends from the first pad across the stack of bonded wafers, the first metal feature in the first wafer and the third metal feature in the second wafer each being in the first metal stack;
    a second metal stack extends from the second pad across the stack of bonded wafers, the second metal feature in the first wafer being in the second metal stack; and
    a third metal stack extends from the third pad across the stack of bonded wafers, the fourth metal feature in the second wafer being in the third metal stack.

10. A method for fabrication, the method comprising:
    bonding a first wafer to a second wafer, the first wafer and the second wafer being included in a stack of bonded wafers, the first wafer including a process control monitor region, the process control monitor region including an array of structure regions, each structure region of the structure regions being a device under test region, a dummy region, a chain interconnect region, or a combination thereof, the stack of bonded wafers including a serpentine chain test structure electrically connected between a first metal feature in the first wafer in a first chain interconnect region in the process control monitor region and a second metal feature in the first wafer in a second chain interconnect region in the process control monitor region, the first chain interconnect region being in a first row of the array, the second chain interconnect region being in a second row of the array, the serpentine chain test structure including segments, one or more segments of the segments being disposed laterally between respective structure regions that are in neighboring columns of the array and that are outside of the first row and the second row; and testing the stack of bonded wafers, the testing including:
applying power to a first pad on the stack of bonded wafers, the first pad being electrically connected to the first metal feature; and
detecting a signal from a second pad on the stack of bonded wafers, the second pad being electrically connected to the second metal feature, the signal being a response of, at least in part, the serpentine chain test structure to the applied power.

11. The method of claim 10, wherein the first row and the second row are a same row of the array.

12. The method of claim 10, wherein the serpentine chain test structure includes serially connected through-substrate vias (TSVs) disposed in a semiconductor substrate of the first wafer.

13. The method of claim 10, wherein the serpentine chain test structure includes serially connected through-substrate vias (TSVs) disposed in a semiconductor substrate of the second wafer.

14. The method of claim 10, wherein the serpentine chain test structure includes first bond pads on the first wafer and second bond pads on the second wafer, ones of the first bond pads being bonded to respective ones of the second bond pads, bonded pairs of the first bond pads and the second bond pads being serially connected.

15. The method of claim 10, wherein the serpentine chain test structure includes:
first bond pads on the first wafer and second bond pads on the second wafer, ones of the first bond pads being bonded to respective ones of the second bond pads; and
through-substrate vias (TSVs) disposed in a semiconductor substrate of the first wafer or the second wafer, the TSVs and bonded pairs of the first bond pads and the second bond pads being serially connected.

16. The method of claim 10 further comprising, after testing the stack of bonded wafers, singulating a multi-die stack from the stack of bonded wafers.

17. A method for testing, the method comprising:
applying power to a first pad on a stack of bonded wafers, the stack of bonded wafers including a process control monitor region, the process control monitor region including an array of structure regions, each structure region of the structure regions being a device under test region, a dummy region, a chain interconnect region, or a combination thereof, the stack of bonded wafers including a serpentine chain test structure electrically connected between a first chain interconnect region in the array of the process control monitor region and a second chain interconnect region in the array of the process control monitor region, the serpentine chain test structure including serially connected segments, one or more segments of the segments being disposed in a region between neighboring structure regions that are in different columns in the array and that are in a row of the array different from a row in which the first chain interconnect region or the second chain interconnect region is disposed, the first pad being electrically connected to the first chain interconnect region; and
detecting a signal from a second pad on the stack of bonded wafers, the second pad being electrically connected to the second chain interconnect region, the signal being a response of, at least in part, the serpentine chain test structure to the applied power.

18. The method of claim 17, wherein the serpentine chain test structure includes serially connected through-substrate vias (TSVs) disposed in a semiconductor substrate of the stack of bonded wafers.

19. The method of claim 17, wherein the serpentine chain test structure includes bonded pairs of pads at a bonding interface in the stack of bonded wafers, the bonded pairs of pads being serially connected.

20. The method of claim 17, wherein the serpentine chain test structure includes:
through-substrate vias (TSVs) disposed in a semiconductor substrate of the stack of bonded wafers; and
bonded pairs of pads at a bonding interface in the stack of bonded wafers, the TSVs and the bonded pairs of pads being serially connected.

* * * * *